(12) United States Patent
Tang et al.

(10) Patent No.: US 11,411,190 B2
(45) Date of Patent: Aug. 9, 2022

(54) CONFORMAL ORGANIC FIELD-EFFECT TRANSISTOR, TRANSISTOR ARRAY, AND PREPARATION METHOD THEREOF

(71) Applicant: NORTHEAST NORMAL UNIVERSITY, Jilin (CN)

(72) Inventors: Qing xin Tang, Jilin (CN); Xiaoli Zhao, Jilin (CN); Yan hong Tong, Jilin (CN); Yi chun Liu, Jilin (CN)

(73) Assignee: NORTHEAST NORMAL UNIVERSITY, Jilin (CN)

( * ) Notice: Subject to any disclaimer, the term of this patent is extended or adjusted under 35 U.S.C. 154(b) by 86 days.

(21) Appl. No.: 17/047,324

(22) PCT Filed: Nov. 28, 2018

(86) PCT No.: PCT/CN2018/117826
§ 371 (c)(1),
(2) Date: Oct. 13, 2020

(87) PCT Pub. No.: WO2019/196423
PCT Pub. Date: Oct. 17, 2019

(65) Prior Publication Data
US 2021/0210704 A1    Jul. 8, 2021

(30) Foreign Application Priority Data

Apr. 11, 2018   (CN) .......................... 201810320087.9

(51) Int. Cl.
*H01L 51/05*       (2006.01)
*H01L 27/28*       (2006.01)
(Continued)

(52) U.S. Cl.
CPC .......... *H01L 51/052* (2013.01); *H01L 27/283* (2013.01); *H01L 51/001* (2013.01);
(Continued)

(58) Field of Classification Search
CPC . H01L 51/052; H01L 51/0003; H01L 51/001; H01L 51/0097; H01L 51/105
See application file for complete search history.

(56) References Cited

FOREIGN PATENT DOCUMENTS

| CN | 102169960 A | 8/2011 |
|----|-------------|--------|
| CN | 104134749 A | 11/2014 |

(Continued)

OTHER PUBLICATIONS

International Search Report issued in corresponding International Application No. PCT/CN2018/117826; dated Mar. 6, 2019; 5 pgs.
(Continued)

*Primary Examiner* — Anthony Ho
(74) *Attorney, Agent, or Firm* — Hauptman Ham, LLP

(57) ABSTRACT

A conformal organic field-effect transistor includes an elastic substrate, a gate electrode, a polymer insulating layer, an organic semiconductor layer, and a source electrode and a drain electrode from the bottom up, the source electrode and the drain electrode being embedded in the organic semiconductor layer. A method of forming the conformal organic field-effect transistor includes depositing an organic semiconductor on a substrate surface to form an organic semiconductor layer, the source electrode and the drain electrode are embedded in the organic semiconductor layer; then preparing the polymer insulating layer on a surface of the organic semiconductor layer; transferring the gate electrode from the substrate; forming hydroxyl groups on a metal electrode surface of the gate electrode, a polymer insulating layer surface of the source electrode, and a polymer insulating layer surface of the drain electrode, respectively; and then performing alignment and heating to obtain the conformal organic field-effect transistor.

11 Claims, 4 Drawing Sheets

(51) Int. Cl.
  *H01L 51/00* (2006.01)
  *H01L 51/10* (2006.01)
(52) U.S. Cl.
  CPC ...... *H01L 51/0003* (2013.01); *H01L 51/0021* (2013.01); *H01L 51/0097* (2013.01); *H01L 51/0545* (2013.01); *H01L 51/0566* (2013.01); *H01L 51/105* (2013.01)

(56) References Cited

FOREIGN PATENT DOCUMENTS

CN 106505148 A 3/2017
JP 2006-222306 A 8/2006

OTHER PUBLICATIONS

Office Action issued in corresponding Chinese Application No. 201810320087.9, dated Aug. 28, 2020; 18 pgs.
Choi et al., "A Study on Reducing Contact Resistance in Solution-Processed Organic Field-Effect Transistors", ACS Applied Materials & Interfaces, vol. 8, pp. 24744-24752, 2016, published Aug. 31, 2016.

CONFORMAL ORGANIC FIELD-EFFECT TRANSISTOR, TRANSISTOR ARRAY, AND PREPARATION METHOD THEREOF

RELATED APPLICATIONS

The present application is a National Phase of International Application Number PCT/CN2018/117826, filed Nov. 28, 2018, and claims priority to Chinese Application Number 201810320087.9, filed Apr. 11, 2018.

FIELD OF THE INVENTION

The present invention relates to a conformal organic field-effect transistor, a transistor array, and a preparation method thereof, belonging to the field of organic electronics.

BACKGROUND OF THE INVENTION

Conformal organic field-effect transistors are a kind of electronic devices having the features of flexibility, elasticity, and ultra-thinness, and can be fitted like skin to surfaces of objects of various shapes. In recent years, with the rapid development of a new generation of electronic products, such as bionic electronic skin, wearable intelligent devices, intelligent displays and so on, conformal field-effect transistors have attracted much attention of researchers (*Nat. Commun.* 2014, 5, 2982; *Nat. Commun.* 2014, 5, 3329; *Nat. Mater.* 2010, 9, 511; *Nat. Commun.* 2012, 3, 770; *Nat. Commun.* 2014, 5, 4147). Compared with inorganic semiconductor materials, organic semiconductor materials have unique advantages in the application of electronic products in the future due to their unique features such as light weight, flexibility, rich material types, and the ability to maintain electrical properties under deformation.

However, there are very few reports about conformal organic field-effect transistors. This is because a whole device must be flexible, elastic, and ultra-thin at the same time to realize such a transistor, which puts forward extremely strict requirements for a preparation process of the device.

At present, there are mainly two kinds of preparation methods for conformal field-effect transistors: (1) one of them is the conventional vacuum mask deposition method, in which ultra-thin flexible organic field-effect transistors are prepared via layer by layer deposition (*Adv. Electron. Mater.* 2016, 2, 1500452; *Adv. Mater.* 2016, 28, 624; *Nat. Commun.* 2014, 5, 4147; *Nature* 2013, 499, 458; *Adv. Mater.* 2013, 25, 5455), such that a certain fitting ability can be obtained. For example, Hu Wenping's research group prepared an organic field-effect transistor by depositing a gate, an insulating layer, a semiconductor, and source/drain electrodes layer by layer on a glass substrate. The whole device was then put into water, under the action of which, the organic field-effect transistor device was stripped off the glass substrate, to form a 320-nm ultra-thin device without a substrate. The advantage of this method of preparing a conformal field-effect transistor using an ultra-thin device is that the process is relatively simple, such that an ultra-thin device can be prepared just by combining conventional vacuum mask deposition and the device stripping technology. The disadvantage of this method is that it is necessary to perform vacuum deposition of a metal electrode directly on a semiconductor, which will cause certain thermal radiation damage to the semiconductor, and even make an organic semiconductor lose field-effect performance in serious conditions (*Adv. Mater.* 2008, 20, 2947; Adv. Mater. 2008, 20, 1511).

The whole device would be as inelastic as paper, such that when the device is fitted to a three-dimensional surface, a large number of wrinkles and bubbles would be produced to prevent perfect fitting. This would seriously affect the stability and reliability of the device after being fitted. In addition, as the electrode is prepared by vacuum mask evaporation, the device has poor precision and low integration, which is not conducive to industrial production. (2) The other method is to prepare an elastic ultra-thin organic field-effect transistor via the layer by layer transfer technology (*Nature* 2016, 539, 411; *Science* 2017, 355, 59). For example, Bao Zhenan's research group has prepared elastically stretchable electrode, insulating layer, and semiconductor on multiple substrates, respectively, and then successively peeled them off and transferred the same to an elastic substrate to form an organic field-effect transistor stretchable as a whole. The advantages of this method of preparing a conformal field-effect transistor by an elastic device include: damage to the semiconductor caused by vacuum evaporation of an electrode can be avoided; the device can be fitted to a three-dimensional surface without a wrinkle or bubble, and maintain the field-effect features in the process of object movement. The disadvantages of this method are as follows: the preparation process of the device is relatively complex; the layers of the device interact with each other through the van der Waals force, which is weak, such that stratification would readily occur in a stretching process; an electrode of the device is prepared by mask spraying, leading to a large sized single device, poor precision, and low integration, which is not conducive to future industrial production. Therefore, it is necessary to provide a new method of preparing a conformal organic field-effect transistor and a device array thereof. The method should not only ensure that the whole device has the features of certain elasticity, flexibility, and ultra-thinness, but also ensure that the device has high integration and precision.

SUMMARY OF THE INVENTION

The purpose of the present invention is to provide a conformal organic field-effect transistor device, its device array, and a preparation method thereof. The process of the method provided in the present invention is simple, and conformal organic field-effect transistors in a large area are prepared by the lamination stripping technology. The prepared device has excellent conformal fitting ability. The device is in a plane embedded structure of bottom gate top contact, i.e., source/drain electrodes are embedded in an organic semiconductor layer. The preparation method of the present invention avoids damages to the organic semiconductor in a photolithography process, such as those caused by thermal radiation, a developer, and a degumming solution. Integration of the photolithography into the conformal organic field-effect transistor ensures that the device can be used to prepare a fine and complex pattern at a high integration degree.

The conformal organic field-effect transistor provided in the present invention comprises an elastic substrate, a gate electrode, a polymer insulating layer, an organic semiconductor layer, a source electrode and a drain electrode from the bottom up; and the source electrode and the drain electrode are embedded in the organic semiconductor layer.

In the conformal organic field-effect transistor, the elastic substrate is formed by an elastic insulating material. The elastic insulating material is organosilicone, polymethylsiloxane, polydimethylsiloxane, or polyurethane.

In the conformal organic field-effect transistor, the polymer insulating layer is formed by an insulating polymer. The insulating polymer is organosilicone, polymethylsiloxane, polydimethylsiloxane, polyurethane, or polyvinyl alcohol.

The polymer insulating layer can have a thickness in the range from 100 nm to 10 µm;

the elastic substrate can have a thickness in the range from 500 nm to 3 mm.

The conformal organic field-effect transistor provided by the present invention can be prepared by the following method:

(1) depositing an organic semiconductor on a surface of a substrate prepared with a source electrode and a drain electrode to form an organic semiconductor layer, the organic semiconductor layer covering the source electrode, the drain electrode, and a surface of the substrate, thus forming a structure in which the source electrode and the drain electrode are embedded in the organic semiconductor layer, followed by preparation of the polymer insulating layer on a surface of the organic semiconductor layer;

preparing an elastic support layer on a surface of a substrate prepared with the gate electrode, the elastic support layer serving as the elastic substrate;

(2) transferring the gate electrode from the substrate; and forming hydroxyl groups on a metal electrode surface of the gate electrode, a polymer insulating layer surface of the source electrode, and a polymer insulating layer surface of the drain electrode, respectively;

(3) aligning and heating the metal electrode surface of the gate electrode, the insulating layer surface of the source electrode, and the insulating layer surface of the drain electrode to connect and form the gate electrode, the source electrode, and the drain electrode into a whole, which is then transferred from the substrate to obtain the conformal organic field-effect transistor.

In the above preparation method, in step (1), the substrate is modified with octadecyltrichlorosilane.

The present invention adopts a gas phase process to modify the substrate with the octadecyltrichlorosilane, comprising the steps of:

after cleaning the substrate, treating the cleaned substrate by oxygen plasma, and placing the substrate into a vacuum drying oven; placing the octadecyltrichlorosilane into the vacuum drying oven; heating the vacuum drying oven and taking out the substrate after cooling the vacuum drying oven to room temperature, and then placing the substrate in trichloromethane for ultrasonic treatment, i.e., modifying the surface of the substrate with octadecyltrichlorosilane.

The substrate can also be modified with the octadecyltrichlorosilane by a liquid phase process, particularly comprising the steps of:

after cleaning the substrate, placing the cleaned substrate still in a mixed solution of concentrated sulfuric acid and hydrogen peroxide; then cleaning the substrate and placing the substrate in a mixed solution of n-heptane and octadecyltrichlorosilane for two hours, i.e., modifying the surface of the substrate with the octadecyltrichlorosilane.

In the above preparation method, the substrate can be a hard substrate, such as silicon, silica, or glass, or can be a flexible substrate, such as polyimide or polyethylene terephthalate.

In the above preparation method, in step (1), prior to depositing the organic semiconductor layer, the method further comprises the step of modifying the metal electrode surface of the source electrode and the metal electrode surface of the drain electrode with pentafluorothiophenol.

The present invention uses a liquid phase process to modify the metal surface with the pentafluorothiophenol, comprising the step of:

immersing the source electrode and the drain electrode in a solution of the pentafluorothiophenol, such as a toluene solution or an ethanol solution thereof, for a time period ranging from 0.5 min to 30 min.

The purpose of modification with the pentafluorothiophenol is to improve the morphology of the organic semiconductor layer deposited on the surface of the electrode to form a good carrier injection effect, which is conducive to obtaining high-performance devices.

In the above preparation method, in step (1), in step (1), the organic semiconductor is deposited by approach 1) or 2) as follows:

1) depositing the organic semiconductor by liquid phase deposition, wherein the organic semiconductor can be 6,13-bis(triisopropylsilylethynyl)pentacene (TIPS-pentacene) or 2,7-dioctyl[1]benzothieno[3,2-b][1]benzothiophene (C8-BTBT);

2) depositing the organic semiconductor by gas phase vacuum thermal deposition, wherein the organic semiconductor can be dinaphtho[2,3-b:2',3'-f]thieno[3,2-b]thiophene (DNTT), N,N'-dipentyl-3,4,9,10-perylene dicarboximide (PTCDI-C5), or 2,7-dioctyl[1]benzothieno[3,2-b][1]benzothiophene (C8-BTBT), wherein the organic semiconductor layer deposited on the substrate surface has a thickness in the range from 2 nm to 100 nm, such as from 50 nm to 100 nm.

In the above preparation method, in step (1), the elastic insulating material is spin-coated on the substrate surface prepared with the gate electrode, and cured to obtain the elastic support layer; and the insulating polymer is spin-coated on the surface of the organic semiconductor layer, and cured to obtain the polymer insulating layer.

The polymer insulating layer is cured at a temperature ranging from 50° C. to 200° C. for a time period ranging from 5 minutes to 120 minutes.

The elastic support layer is cured at a temperature ranging from 50° C. to 200° C. for a time period ranging from 5 minutes to 120 minutes.

In the above preparation method, in step (1), the source electrode, the drain electrode, and the gate electrode are all prepared on the substrates by photolithography and vacuum evaporation.

The lithography is performed in the following conditions.

Photoresist is spin-coated on the substrate and exposed to an ultraviolet lamp after being heated, and then after development and fixation successively, the metal is vapor deposited.

In particular, the following steps can be performed:

spin-coating a layer of photoresist, which can be AZ5200NJ or AZ5214, on the substrate; placing and heating the substrate spin-coated with photoresist on a 100° C. oven; exposing the heated substrate spin-coated with photoresist to a 365-nm ultraviolet lamp for 10 s; developing the exposed substrate in a developer for 1 min; performing fixation in deionized water for 30 s; evaporating the metal by vacuum evaporation on the substrate photoetched with a pattern; and finally removing the photoresist with a degumming solution to form a patterned metal.

In the above preparation method, in step (2), the hydroxyl groups are formed on the metal electrode surface of the gate electrode, the polymer insulating layer surface of the source electrode, and the polymer insulating layer surface of the drain electrode by oxygen plasma treatment; and the oxygen plasma treatment is performed for a time period ranging from 10 s to 100 s.

In the above preparation method, in step (3), the heating can be performed at a temperature ranging from 60° C. to 100° C.

During alignment, the metal electrode surface of the gate electrode is fitted to the polymer insulating layer surface of the source electrode and the polymer insulating layer surface of the drain electrode.

The present invention further provides a conformal organic field-effect transistor prepared by the above method.

The conformal field-effect transistor provided by the present invention can form a conformal field-effect transistor array.

DETAILED DESCRIPTION OF EMBODIMENTS

Figure 1:
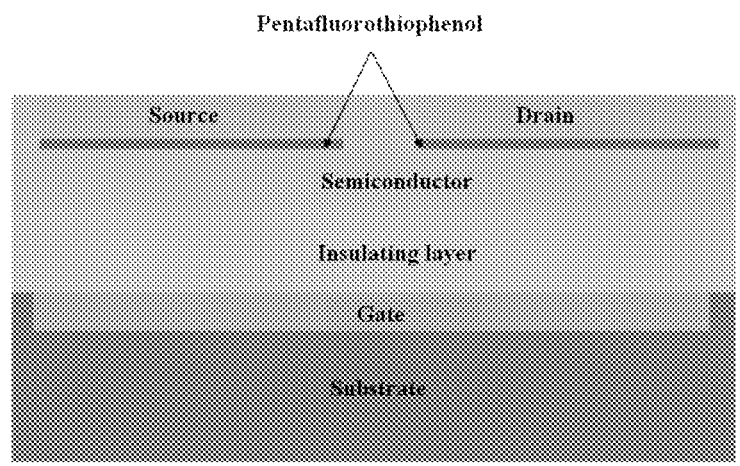
FIG. 1 shows a structural diagram of a conformal field-effect transistor.

The experimental methods used in the following examples are conventional methods unless otherwise specified.

The materials, reagents, etc. used in the following examples are commercially available unless otherwise specified.

EXAMPLE 1

Preparation of DNTT conformal Organic Field-Effect Transistor And Transistor Array (1) Octadecyltrichlorosilane was connected to a surface of a silicon substrate by a gas phase process. A cleaned silicon substrate, after being treated by oxygen plasma (for a time period of 30 s), was placed into a vacuum drying oven. Octadecyltrichlorosilane was also placed into the vacuum drying oven. After the vacuum drying oven was heated (to a temperature of 60° C.), the silicon substrate was taken out. The silicon substrate was then placed into trichlormethane for ultrasonic treatment, taken out, and dried with nitrogen. In this way, octadecyltrichlorosilane was connected to the surface of the silicon substrate.

(2) On the silicon substrates having gone through step (1), a source electrode and a drain electrode were prepared on one substrate, and a gate electrode was prepared on another substrate by photolithography. A layer of photoresist, model AZ5200NJ, was spin-coated on the silicon substrate. The substrate spin-coated with photoresist was placed at an oven at 100° C. and heated. The heated substrate spin-coated with photoresist was then exposed to a 365-nm ultraviolet lamp for 10 s. The exposed silicon substrate was then placed into a developer and developed for 1 min, followed by fixation in deionized water for 30 s. A metal was then evaporated by vacuum evaporation on the silicon substrate where a pattern was photoetched. The photoresist was finally removed by a degumming solution to form a patterned metal. In this way, the electrode was formed on the substrate.

(3) A surface of the metal electrode of the source electrode and a surface of the metal electrode of the drain electrode obtained in step (2) were modified with pentafluorothiophenol. The substrate prepared with the source electrode and the drain electrode as obtained in step (2) was placed still and immersed in a mixed solution of pentafluorothiophenol and toluene for 2 min, to finally form a pentafluorothiophenol layer on the surface of the substrate. The purpose of this step was to obtain high performance devices.

(4) DNTT was deposited on the surface of the substrate prepared with the source electrode and the drain electrode as obtained in step (3). Organic semiconductor material DNTT was deposited on the surface of the substrate prepared with the source electrode and the drain electrode as obtained in step (3), with an evaporation rate of 0.1 Å/s, a substrate temperature of 60° C., and a thickness of a DNTT layer deposited on the surface of the substrate surface 50 nm. The DNTT layer covered the source electrode, the drain electrode, and the surface of substrate, to form a structure in which the source electrode and the drain electrode were embedded in the DNTT layer.

(5) An insulating polymer organosilicone was spin-coated on a surface of the DNTT layer as obtained in step (4), and cured (at a temperature of 100° C. for 2 h) to form a polymer insulating layer, with a thickness of 500 nm. Elastic insulating material polydimethylsiloxane was spin-coated on the surface of the substrate prepared with the gate electrode as obtained in step (1), and cured (at a temperature of 60° C. for 1 h) to form an elastic support layer, which served as an elastic substrate, with a thickness of 20 μm.

(6) The gate electrode spin-coated with the elastic support layer was transferred from the substrate.

(7) The metal electrode surface of the gate electrode, the polymer insulating layer surface of the source electrode, and the polymer insulating layer surface of the drain electrode were treated with oxygen plasma for 100 s, respectively, i.e., to form hydroxyl groups on the surfaces.

(8) The metal electrode surface of the gate electrode, the polymer insulating layer surface of the source electrode, and the polymer insulating layer surface of the source electrode of the drain electrode were aligned (surface connection was performed under a microscope using a positive coordinate pattern), placed in an oven, and heated to 60° C.

(9) After the gate electrode, the source electrode, and the drain electrode were connected to form a whole in step (8), the gate electrode, the source electrode and the drain electrode, the insulating layer, and the semiconductor layer were transferred away from the substrate loaded with the source electrode and the drain electrode, i.e., to obtain a conformal field-effect transistor.

FIG. 1 schematically showed a prepared conformal field-effect transistor (the substrate in the figure is the prepared elastic support layer, i.e., the elastic substrate).

Figure 2:
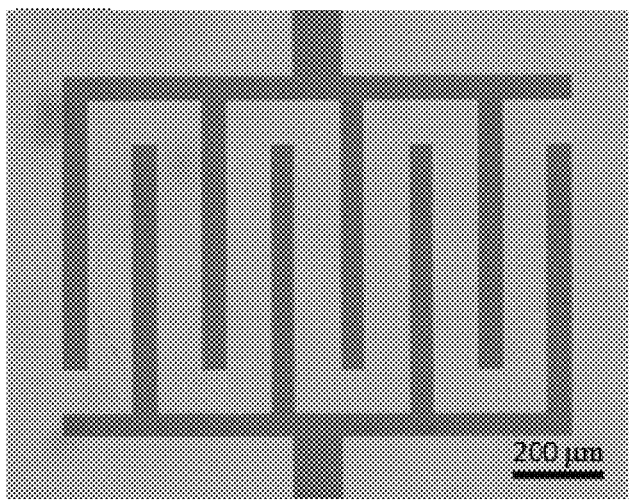
FIG. 2 (a) and FIG. 2 (b) shows microscope diagrams of DNTT conformal organic field-effect transistors of different sizes prepared in Example 1 of the present invention.
Figure 2:
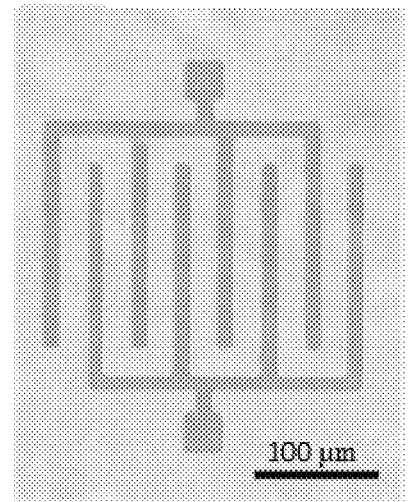

FIG. 2 (a) and FIG. 2 (b) showed microscope diagrams of DNTT conformal field-effect transistors of different sizes.

Figure 3:
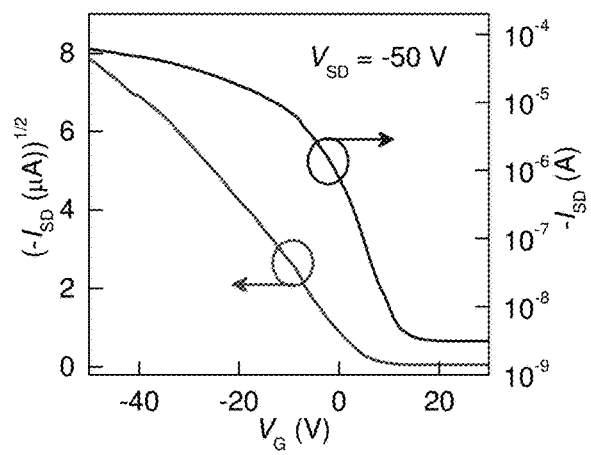
FIG. 3 (a) and FIG. 3 (b) shows transfer curves (FIG. 3 (a)) and output curves (FIG. 3 (b)) of the DNTT conformal field-effect transistors prepared in Example 1 of the present invention.
Figure 3:
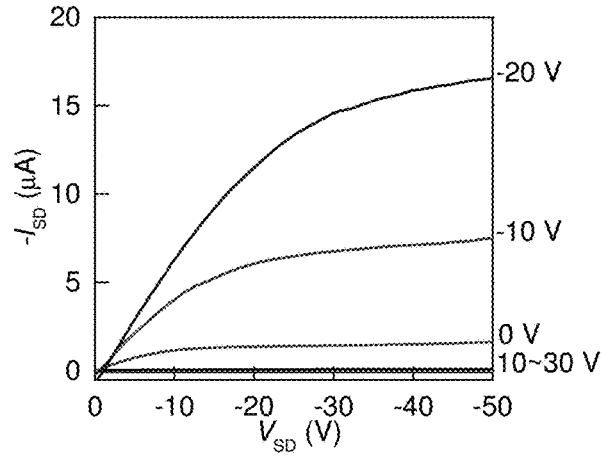

FIG. 3 (a) and FIG. 3 (b) showed transfer curves (FIG. 3 (a)) and output curves (FIG. 3 (b)) of the prepared DNTT conformal field-effect transistors, with a device mobility rate of 0.38 $cm^2V^{-1}s^{-1}$, a threshold voltage of 4.4 V, and a switching ratio of $2\times10^4$.

Figure 4:
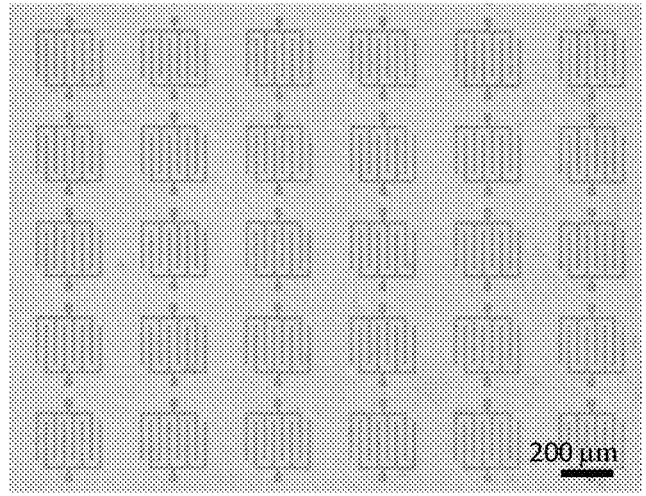
FIG. 4 shows a microscope diagram of DNTT conformal field-effect transistor array prepared in Example 1 of the present invention.
Figure 5:
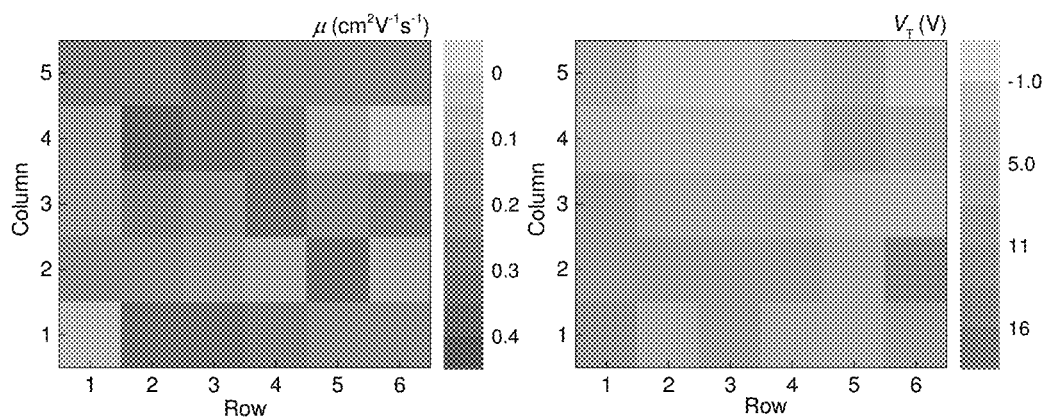
FIG. 5 (a) and FIG. 5 (b) shows mobility (FIG. 5 (a)) and threshold voltage (FIG. 5 (b)) performance distribution of DNTT conformal field-effect transistor array prepared in Example 1 of the present invention.

The method of the present invention not only can be used to prepare a single device, but also can realize a large area and high precision transistor array. FIG. 4 showed a microscope diagram of the prepared DNTT conformal field-effect transistor array. FIG. 5 (a) and FIG. 5 (b) showed mobility (FIG. 5 (a)) and threshold voltage (FIG. 5 (b)) performance distribution of the prepared DNTT conformal field-effect transistor array. The device array displayed relatively good device homogeneity, with an average mobility rate of 0.233±0.08061 $cm^2V^{-1}s^{-1}$ and an average threshold voltage of 6.575±3.46512 V, indicating that the device had excellent field effect performance.

EXAMPLE 2

Preparation of TIPS-Pentacene Conformal Organic Field-Effect Transistor (1) Octadecyltrichlorosilane was connected to a surface of a silicon substrate by a liquid phase process. A cleaned substrate was placed still in a mixed solution of concentrated sulfuric acid and hydrogen peroxide. The substrate was then cleaned, and placed in a mixed solution of n-heptane and octadecyltrichlorosilane for 2 h. In this way—octadecyltrichlorosilane was connected to a surface of the substrate.

(2) On the substrates having gone through step (1), a source electrode and a drain electrode were prepared on one substrate, and a gate electrode was prepared on another substrate by photolithography. A layer of photoresist, model AZ5214, was spin-coated on the substrate. The substrate spin-coated with the photoresist was placed on a 100° C. oven and heated. The heated substrate spin-coated with the photoresist was then exposed to a 365-nm ultraviolet lamp for 10 s. And then the exposed substrate was placed into a developer and developed for 1 min, followed by fixation in deionized water for 30 s. A metal was evaporated by vacuum evaporation on the substrate where a pattern was photoetched. The photoresist was finally removed by a degumming solution to form a patterned metal, i.e., an electrode was formed on the substrate.

(3) Pentafluorothiophenol was connected to a metal electrode surface of the source electrode and a metal electrode surface of the drain electrode as obtained in step (2). The substrate prepared with the source electrode and the drain electrode as obtained in step (2) was placed in a mixed solution of pentafluorothiophenol and toluene and immersed for 10 min, to finally form a pentafluorothiophenol layer on the electrode surface.

(4) TIPS-pentacene was deposited on a surface of the substrate prepared with the source electrode and the drain electrode as obtained in step (3). Organic semiconductor material TIPS-pentacene was deposited in drips by a liquid phase process, with the deposition temperature being room temperature. The semiconductor was dissolved in n-hexane, with the concentration of the solution being 0.4 mg/ml, and the TIPS-pentacene layer deposited on the substrate surface having a thickness of 100 nm. The TIPS-pentacene layer covered the source electrode, the drain electrode, and substrate surface, to form a structure in which the source electrode and the drain electrode were embedded in the TIPS-pentacene layer.

(5) Insulating polymer organosilicone was spin-coated on a surface of the TIPS-pentacene layer as obtained in step (4), and cured (at a temperature of 60° C. for a time period of 1 h) to form a polymer insulating layer, with a thickness of 300 nm. Elastic insulating material polydimethylsiloxane was spin-coated on the substrate surface where the gate electrode was prepared as obtained in step (1), and cured (at a temperature of 60° C. for a time period of 1 h), to form an elastic layer, which served as the elastic substrate layer (the substrate of the product), with a thickness of 10 μm.

(6) The gate electrode spin-coated with the elastic support layer was transferred from the substrate.

(7) The metal electrode surface of gate electrode, the polymer insulating layer surface of the source electrode, and the polymer insulating layer surface of the drain electrode were treated with oxygen plasma for 100 s, respectively, i.e., to form hydroxyl groups on the surfaces.

(8) The metal electrode surface of the gate electrode, the polymer insulating layer surface of the source electrode, and the polymer insulting layer surface of the drain electrode were aligned (surface connection was performed under a microscope using a positive coordinate pattern), placed into an oven, and heated to 100° C.

(9) After the gate electrode, the source electrode, and the drain electrode were connected to form a whole in step (8), the gate electrode, the source electrode and the drain electrode, the insulating layer, and the semiconductor layer were transferred from the substrate loaded with the source electrode and the drain electrode, to obtain a conformal organic field-effect transistor.

Figure 6:
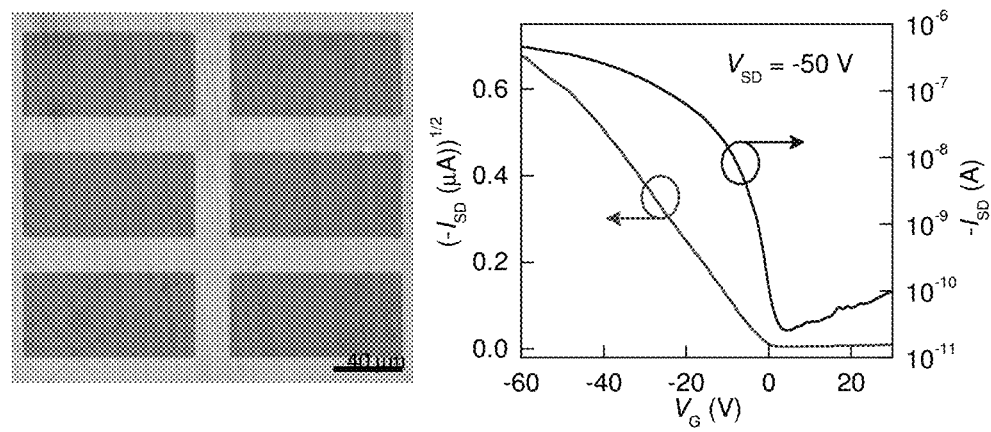
FIG. 6 (a) and FIG. 6 (b) shows microscope diagrams (FIG. 6 (a)) and transfer curves (FIG. 6 (b)) of TIPS-pentacene conformal field-effect transistors prepared in Example 2 of the present invention.

FIG. 6 (a) and FIG. 6 (b) showed microscope diagrams (FIG. 6 (a)) and transfer curves (FIG. 6 (b)) of the TIPS-pentacene single crystal array conformal field-effect transistors prepared in this example, with a device mobility rate being 0.024 $cm^2v^{-1}s^{-1}$ and a threshold voltage being −0.19 V. This indicated a very small turn-on voltage of the device and was conducive to reducing power consumption thereof.

EXAMPLE 3

Preparation of C8-BTBT Conformal Organic Field-Effect Transistor (1) Octadecyltrichlorosilane was connected on a surface of a substrate by a liquid phase process. A cleaned substrate was placed still in a mixed solution of concentrated sulfuric acid and hydrogen peroxide. The substrate was then cleaned, and placed in a mixed solution of n-heptane and octadecyltrichlorosilane for 2 h. In this way, octadecyltrichlorosilane was connected to a surface of the substrate.

(2) On the substrates having gone through step (1), a source electrode and a drain electrode were prepared on one substrate, and a gate electrode was prepared on another substrate by photolithography. A layer of photoresist, model AZ5200NJ, was spin-coated on the substrate. The substrate spin-coated with the photoresist was placed on a 100° C. oven and heated. The heated substrate spin-coated with the photoresist was exposed to a 365-nm ultraviolet lamp for 10 s. The exposed substrate was then placed into a developer and developed for 1 min, followed by fixation in deionized water for 30 s. A metal was evaporated by vacuum evaporation on the substrate where a pattern was photoetched. The photoresist was finally removed by a degumming solution to form a patterned metal. In this way, an electrode was formed on the substrate.

(3) Pentafluorothiophenol was connected to a metal electrode surface of the source electrode and a metal electrode surface of the drain electrode as obtained in step (2). The substrate prepared with the source electrode and the drain electrode as obtained in step (2) was placed still in a mixed solution of pentafluorothiophenol and ethanol and immersed for 2 min, to finally form a pentafluorothiophenol layer on the electrode surface.

(4) C8-BTBT was deposited on the substrate surface prepared with the source electrode and the drain electrode as obtained in step (3). Organic semiconductor material C8-BTBT was deposited on the substrate surface prepared with the source electrode and the drain electrode as obtained in step (3), with an evaporation rate of 0.3 Å/s and a substrate temperature of 60° C. A C8-BTBT layer deposited on the substrate surface had a thickness of 50 nm, and covered the source electrode, the drain electrode, and the surface of the substrate, to form a structure in which the source electrode and the drain electrode were embedded in the C8-BTBT layer.

(5) Insulating polymer organosilicone and polyvinyl alcohol were spin-coated on a surface of the C8-BTBT layer as obtained in step (4), and cured (at a temperature of 60° C. for a time period of 2 h), to form a polymer insulating layer with a thickness of 700 nm. Elastic insulating material polydimethylsiloxane was spin-coated on the substrate surface prepared with the gate electrode as obtained in step (1), and cured (at a temperature of 100° C. for a time period of 20 min), to form the elastic support layer serving as the elastic substrate (substrate of the product), with a thickness of 50 µtm.

(6) The gate electrode spin-coated with elastic support layer was transferred from the substrate.

(7) The metal electrode surface of the gate electrode, the polymer insulating layer surface of the source electrode, and the polymer insulating layer surface of the drain electrode were treated with oxygen plasma for 60 s, respectively, to form hydroxyl groups on the surfaces.

(8) The metal electrode surface of the gate electrode, the polymer insulating layer surface of the source electrode, and the polymer insulating layer surface of the drain electrode were aligned (surface connection was performed under a microscope using a positive coordinate pattern), placed into an oven, and heated to 60° C.

(9) After the gate electrode, the source electrode, and the drain electrode were connected to form a whole in step (8), the gate electrode, the source electrode and the drain electrode, the insulating layer, and the semiconductor layer were transferred from the substrate loaded with the source electrode and the drain electrode to obtain a conformal organic field-effect transistor.

Figure 7:
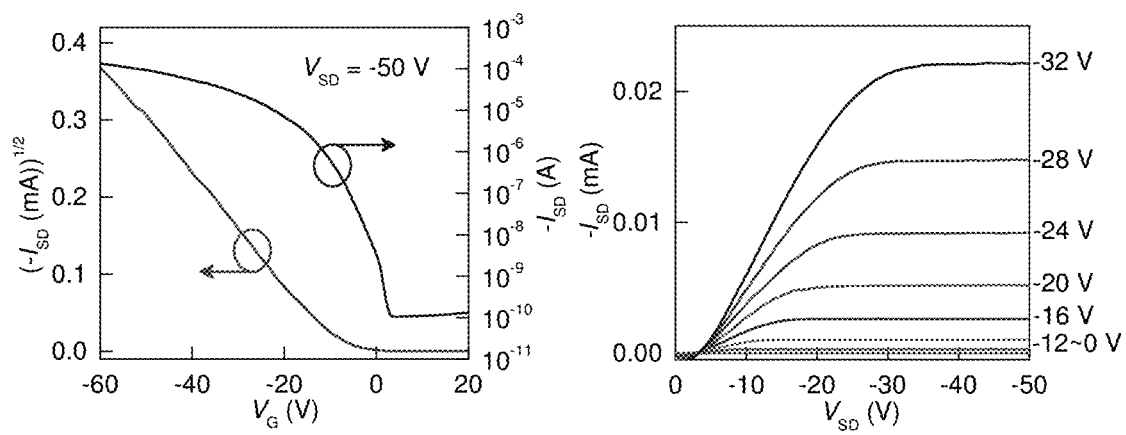
FIG. 7 (a) and FIG. 7 (b) shows transfer curves (FIG. 7 (a)) and output curves (FIG. 7 (b)) of C8-BTBT conformal field-effect transistors prepared in Example 3 of the present invention.

FIG. 7 (a) and FIG. 7 (b) showed transfer curves (FIG. 7 (a)) and output curves (FIG. 7 (b)) of the C8-BTBT conformal field-effect transistors prepared in this example, with a device mobility rate being 1.32 $cm^2v^{-1}s^{-1}$, a threshold voltage being −8.89 V, and a switching ratio being $6\times10^5$. This indicated that the device had excellent field-effect performance.

INDUSTRIAL APPLICATION

The present invention has the following beneficial effects: The present invention provides a preparation method of a conformal field-effect transistor and a transistor array. The process of the method provided in the present invention is simple. Conformal field-effect transistors in a large area and a device array thereof are prepared by the lamination stripping technology. It is suitable for a variety of organic semiconducting materials. As respective components of the transistor all have excellent flexibility or elasticity, the device and the device array have excellent flexibility and conformal fitting ability. The source/drain electrodes are embedded in the organic semiconductor layer to form a firm contact between the electrode, the organic semiconductor, and the insulating layer, preventing the delamination phenomenon in a bending process of the transistor. The preparation method provided by the present invention eliminates the damages to the organic semiconductor in the photolithography process, such as damages caused by the thermal radiation, the developer, and the degumming solution. The present invention successfully integrates the photolithography technology with the organic semiconductor to prepare high-precision and complex organic field-effect transistors and transistor arrays, realizing high integration and facilitating industrial production.

The invention claimed is:

1. A preparation method of a conformal organic field-effect transistor, comprising the steps of:
   depositing an organic semiconductor on a surface of a substrate prepared with a source electrode and a drain electrode to form an organic semiconductor layer, the organic semiconductor layer covering the source electrode, the drain electrode, and a surface of the substrate, thus forming a structure in which the source electrode and the drain electrode are embedded in the organic semiconductor layer, followed by preparation of a polymer insulating layer on a surface of the organic semiconductor layer;
   preparing an elastic support layer on a surface of a substrate prepared with the gate electrode, the elastic support layer serving as the elastic substrate;
   transferring the gate electrode from the substrate; and forming hydroxyl groups on a metal electrode surface of the gate electrode, a polymer insulating layer surface of the source electrode, and a polymer insulating layer surface of the drain electrode, respectively;
   aligning and heating the metal electrode surface of the gate electrode, the insulating layer surface of the source electrode, and the insulating layer surface of the drain electrode to connect and form the gate electrode, the source electrode, and the drain electrode into a whole, which is then transferred from the substrate to obtain the conformal organic field-effect transistor.

2. The preparation method according to claim 1, wherein: in step 1), the substrate is modified thereon with octadecyltrichlorosilane.

3. The preparation method according to claim 2, wherein the substrate is modified with the octadecyltrichlorosilane in a gas phase process, comprising the steps of:
   after cleaning the substrate, treating the cleaned substrate by oxygen plasma, and placing the substrate into a vacuum drying oven; placing the octadecyltrichlorosilane into the vacuum drying oven; heating the vacuum drying oven and taking out the substrate after cooling the vacuum drying oven to room temperature, and then placing the substrate in trichloromethane for ultrasonic treatment, i.e., modifying the surface of the substrate with octadecyltrichlorosilane; or
   wherein the substrate is modified with the octadecyltrichlorosilane in a liquid phase process, comprising the steps of:

after cleaning the substrate, placing the cleaned substrate still in a mixed solution of concentrated sulfuric acid and hydrogen peroxide; then cleaning the substrate and placing the substrate in a mixed solution of n-heptane and octadecyltrichlorosilane, i.e., modifying the surface of the substrate with the octadecyltrichlorosilane.

4. The preparation method according to claim 1, wherein in step (1), prior to depositing the organic semiconductor layer, the method further comprises the step of modifying the metal electrode surface of the source electrode and the metal electrode surface of the drain electrode with pentafluorothiophenol.

5. The preparation method according to claim 4, wherein the metal electrode surface is modified with the pentafluorothiophenol by a liquid phase process, comprising the step of:
immersing the source electrode and the drain electrode in a solution of the pentafluorothiophenol.

6. The preparation method according to claim 1, wherein in step (1), the organic semiconductor is deposited by approach 1) or 2) as follows:
1) depositing the organic semiconductor by liquid phase deposition, the organic semiconductor being 6,13-bis (triisopropylsilylethynyl)pentacene or 2,7-dioctyl[1] benzothieno[3,2-b][1]benzothiophene;
2) depositing the organic semiconductor by gas phase vacuum thermal deposition, the organic semiconductor being dinaphtho[2,3-b:2',3'-f]thieno[3,2-b]thiophene, N,N'-dipentyl-3,4,9,10-perylene dicarboximide, or 2,7-dioctyl[1]benzothieno[3,2-b][1]benzothiophene,
wherein the organic semiconductor layer deposited on the substrate surface has a thickness in the range from 2 nm to 100 nm.

7. The preparation method according to claim 1, wherein in step (1), the elastic insulating material is spin-coated on the substrate surface prepared with the gate electrode, and cured to obtain the elastic support layer; and
the insulating polymer is spin-coated on the surface of the organic semiconductor layer, and cured to obtain the polymer insulating layer.

8. The preparation method according to claim 7, wherein the elastic support layer is cured at a temperature ranging from 50° C. to 200° C. for a time period ranging from 5 minutes to 120 minutes; and
wherein the polymer insulating layer is cured at a temperature ranging from 50° C. to 200° C. for a time period ranging from 5 minutes to 120 minutes.

9. The preparation method according to claim 1, wherein in step (1), the source electrode, the drain electrode, and the gate electrode are all prepared on the substrates by photolithography and vacuum evaporation.

10. The preparation method according to claim 1, wherein in step (2), the hydroxyl groups are formed on the metal electrode surface of the gate electrode, the polymer insulating layer surface of the source electrode, and the polymer insulating layer surface of the drain electrode by oxygen plasma treatment,
wherein the oxygen plasma treatment is performed for a time period ranging from 10 s to 100 s.

11. The preparation method according to claim 1, wherein in step (3), the heating is performed at a temperature ranging from 60° C. to 100° C.

* * * * *